(12) United States Patent
Li et al.

(10) Patent No.: US 8,988,065 B2
(45) Date of Patent: Mar. 24, 2015

(54) MICROPROBE AND MICROPROBE MANUFACTURING METHOD

(71) Applicant: Kabushiki Kaisha Toshiba, Minato-ku, Tokyo (JP)

(72) Inventors: Yongfang Li, Kawasaki (JP); Yasushi Tomizawa, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/191,692

(22) Filed: Feb. 27, 2014

(65) Prior Publication Data

US 2014/0283230 A1    Sep. 18, 2014

(30) Foreign Application Priority Data

Mar. 15, 2013    (JP) ................... 2013-054240

(51) Int. Cl.
*G01R 1/06*    (2006.01)
*G11B 9/14*    (2006.01)
(Continued)

(52) U.S. Cl.
CPC .......... *G11B 9/1409* (2013.01); *B81C 1/00531* (2013.01); *G03F 7/0002* (2013.01); *G01R 1/06744* (2013.01); *G01R 3/00* (2013.01)
USPC ...... 324/149; 324/437; 324/755.01; 324/724; 369/126; 369/13.17; 369/112.24; 369/300; 250/306; 251/11; 850/57

(58) Field of Classification Search
CPC .......... G01R 1/06733; G01R 1/07342; G01R 1/06711; G01R 1/06727; G01R 1/06744; G01R 1/06738; G01R 1/07307; G01R 3/00; B81B 2203/0118; B81B 2203/04; B81B 2201/055; G01Q 70/08

USPC .......... 324/149, 437, 755.01, 724; 369/126, 369/13.17, 112.24, 300; 250/306; 251/11; 850/57
See application file for complete search history.

(56) References Cited

U.S. PATENT DOCUMENTS 5,475,318 A * 12/1995 Marcus et al. ........... 324/755.07
6,016,686 A *  1/2000 Thundat ....................... 73/23.2
(Continued)

FOREIGN PATENT DOCUMENTS

JP    2001-174491    6/2001
JP    2004-354369    12/2004
(Continued)

OTHER PUBLICATIONS

Japanese Office Action for Japanese Patent Application No. 2013-054240 mailed on Mar. 25, 2014.
(Continued)

*Primary Examiner* — Patrick Assouad
*Assistant Examiner* — Sean Curtis
(74) *Attorney, Agent, or Firm* — Amin, Turocy & Watson, LLP

(57) ABSTRACT

According to an embodiment, a microprobe includes a base and a lever. The base includes a first electrode provided on a surface thereof. The lever is supported by the base and includes a second electrode and a third electrode. The second electrode is connected between the first electrode and the third electrode. The third electrode is formed to project from the second electrode in a first direction in a main surface of the lever. A width of the third electrode in a second direction perpendicular to the first direction in the main surface defines a width of an electrical contact area when a scanning operation is performed by use of the third electrode in a third direction perpendicular to the main surface.

15 Claims, 15 Drawing Sheets

(51) Int. Cl.
*B81C 1/00* (2006.01)
*G03F 7/00* (2006.01)
*G01R 1/067* (2006.01)
*G01R 3/00* (2006.01)

(56) References Cited

U.S. PATENT DOCUMENTS

| | | | |
|---|---|---|---|
| 6,127,908 A * | 10/2000 | Bozler et al. | 333/246 |
| 6,236,491 B1 * | 5/2001 | Goodwin-Johansson | 359/291 |
| 6,344,752 B1 * | 2/2002 | Hagihara et al. | 324/756.03 |
| 6,646,525 B2 * | 11/2003 | Bozler et al. | 333/246 |
| 6,799,074 B1 * | 9/2004 | Thomas et al. | 607/116 |
| 6,862,921 B2 * | 3/2005 | Chand et al. | 73/105 |
| 6,876,283 B1 * | 4/2005 | Weber et al. | 335/78 |
| 6,975,124 B2 * | 12/2005 | Worledge | 324/724 |
| 7,078,778 B2 * | 7/2006 | Schenk | 257/417 |
| 7,119,557 B2 * | 10/2006 | Lee | 324/755.01 |
| 7,136,215 B1 * | 11/2006 | Machida et al. | 359/295 |
| 7,170,054 B2 * | 1/2007 | Iyoki et al. | 250/306 |
| 7,281,419 B2 | 10/2007 | Wang et al. | |
| 7,444,856 B2 * | 11/2008 | Prinz et al. | 73/105 |
| 7,447,140 B2 | 11/2008 | Lutwyche et al. | |
| 7,511,523 B2 * | 3/2009 | Chen et al. | 324/755.01 |
| 7,522,029 B1 * | 4/2009 | Lantz | 337/139 |
| 7,687,297 B2 * | 3/2010 | Heck et al. | 438/50 |
| 8,331,212 B2 * | 12/2012 | Li et al. | 369/126 |
| 8,704,316 B2 * | 4/2014 | Nguyen et al. | 257/415 |
| 8,717,055 B2 * | 5/2014 | Chen et al. | 324/755.07 |
| 2002/0030566 A1 * | 3/2002 | Bozler et al. | 333/246 |
| 2004/0183149 A1 * | 9/2004 | Schenk | 257/415 |
| 2004/0217350 A1 | 11/2004 | Sugiura et al. | |
| 2006/0043290 A1 * | 3/2006 | Iyoki et al. | 250/309 |
| 2009/0001486 A1 * | 1/2009 | Heck et al. | 257/415 |
| 2009/0009200 A1 * | 1/2009 | Nielsen et al. | 324/758 |
| 2010/0176834 A1 * | 7/2010 | Chen et al. | 324/762 |
| 2010/0213789 A1 * | 8/2010 | Igarashi | 310/300 |
| 2011/0187397 A1 * | 8/2011 | Chen et al. | 324/755.07 |
| 2011/0187398 A1 * | 8/2011 | Chen et al. | 324/755.07 |
| 2011/0194398 A1 * | 8/2011 | Li et al. | 369/126 |
| 2012/0061009 A1 * | 3/2012 | Chen et al. | 156/150 |
| 2012/0062213 A1 * | 3/2012 | Li et al. | 324/149 |
| 2012/0062260 A1 * | 3/2012 | Chen et al. | 324/755.07 |
| 2012/0064226 A1 * | 3/2012 | Chen et al. | 427/58 |
| 2012/0064227 A1 * | 3/2012 | Chen et al. | 427/58 |
| 2013/0168782 A1 * | 7/2013 | Jahnes et al. | 257/415 |

FOREIGN PATENT DOCUMENTS

| | | |
|---|---|---|
| JP | 2007-225581 | 9/2007 |
| JP | 2010-159997 | 7/2010 |

OTHER PUBLICATIONS

Final Office Action for Japanese Patent Application No. 2013-054240 Dated Dec. 16, 2014, 7 pages.

* cited by examiner

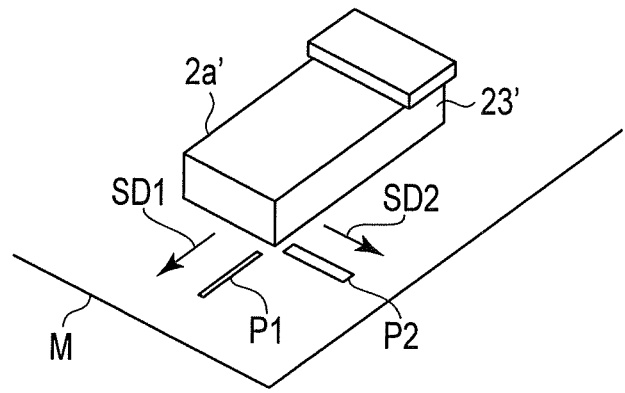
F I G. 5A
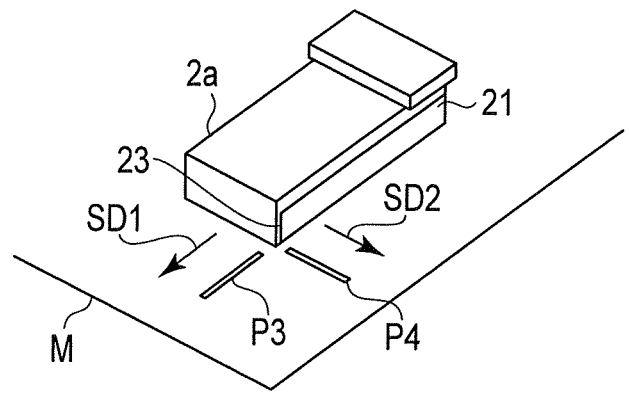
F I G. 5B

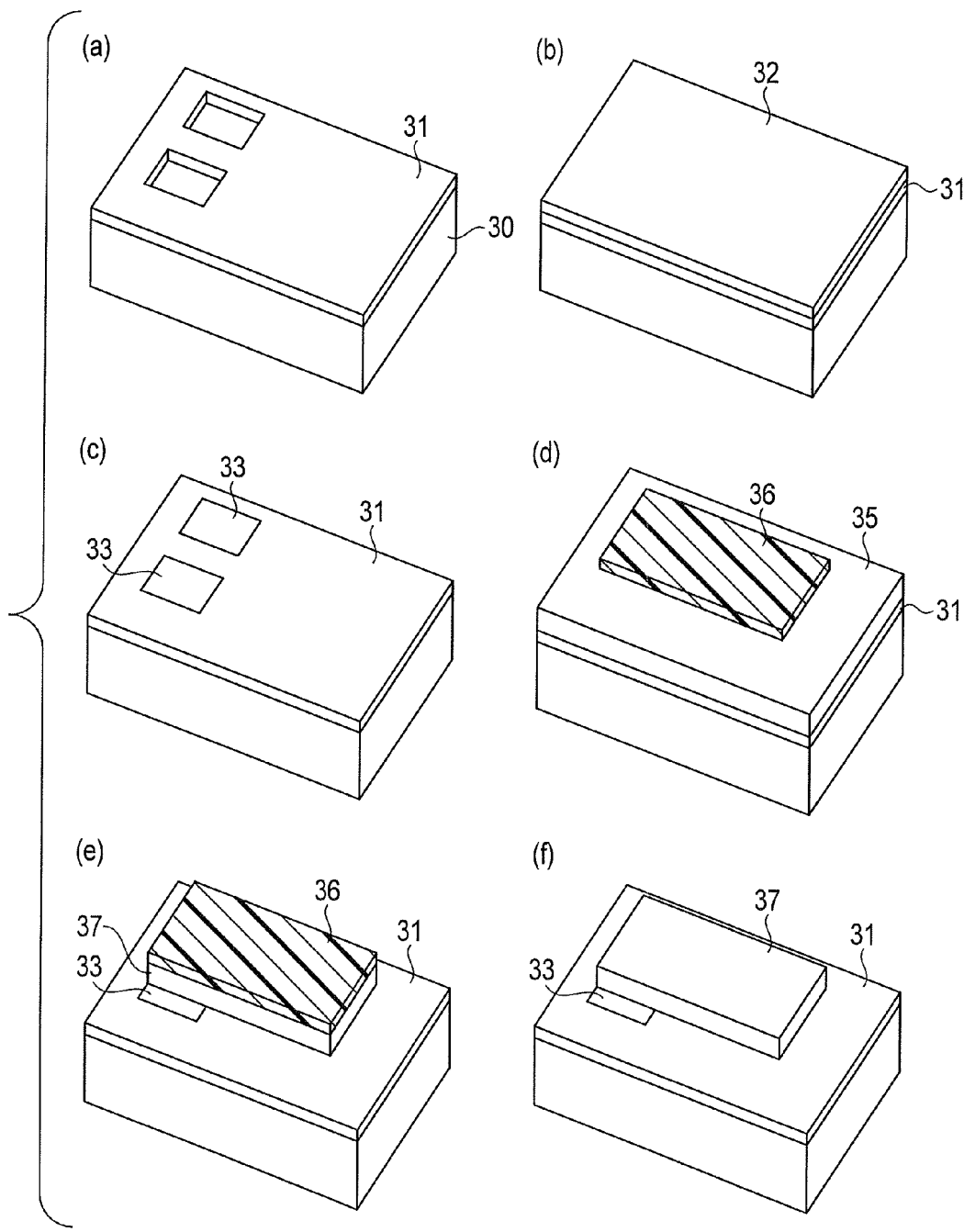
F I G. 6A

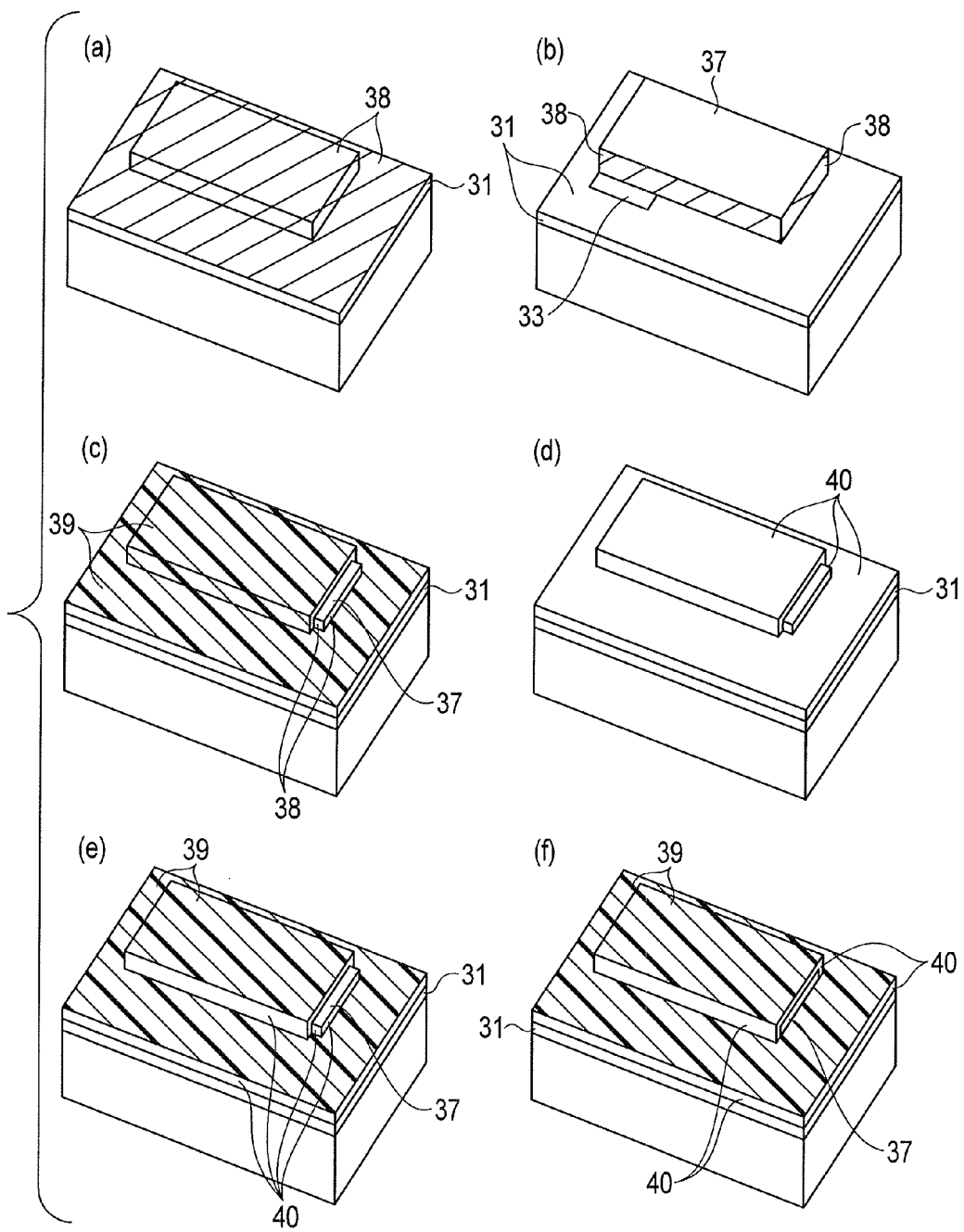
F I G. 6B

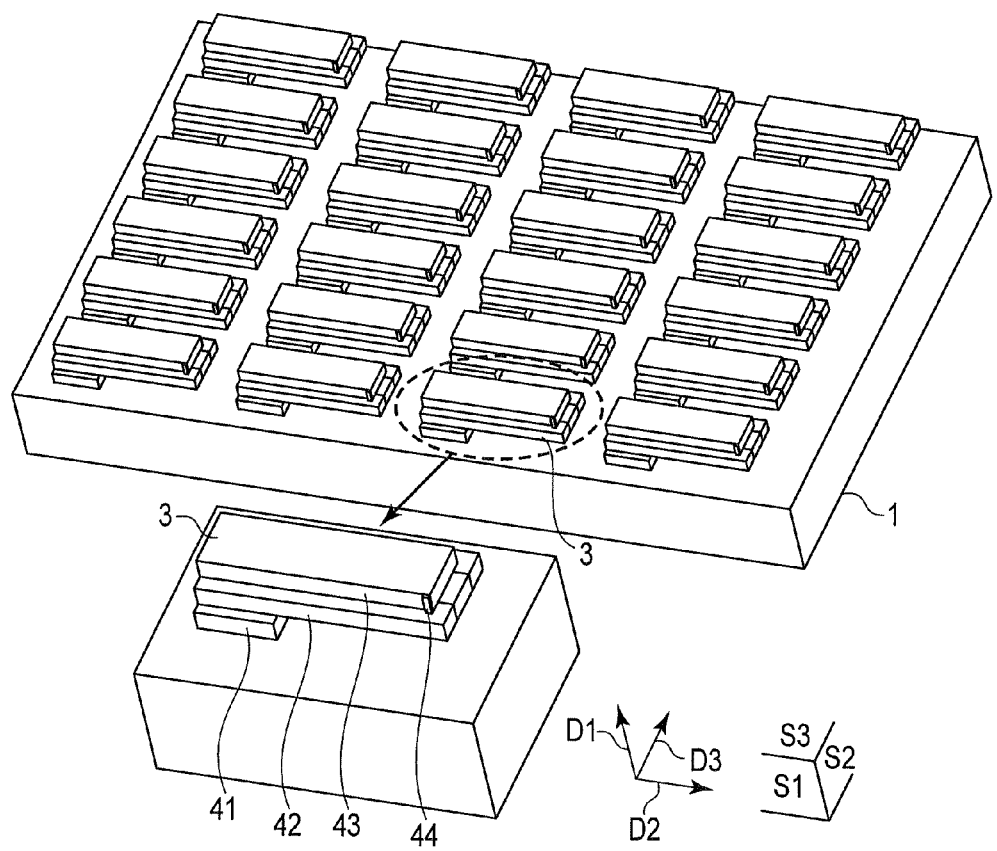
F I G. 7

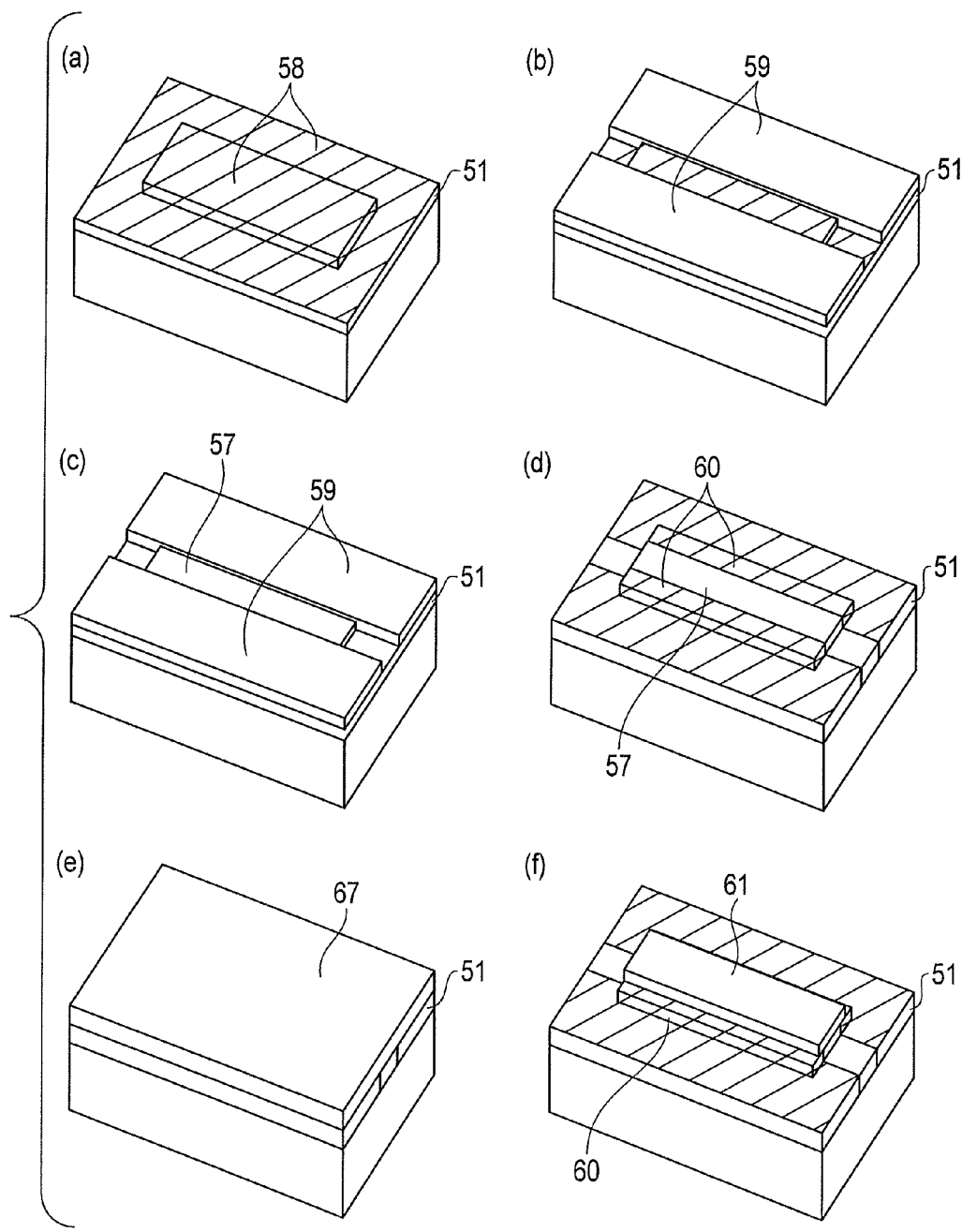
F I G. 8B

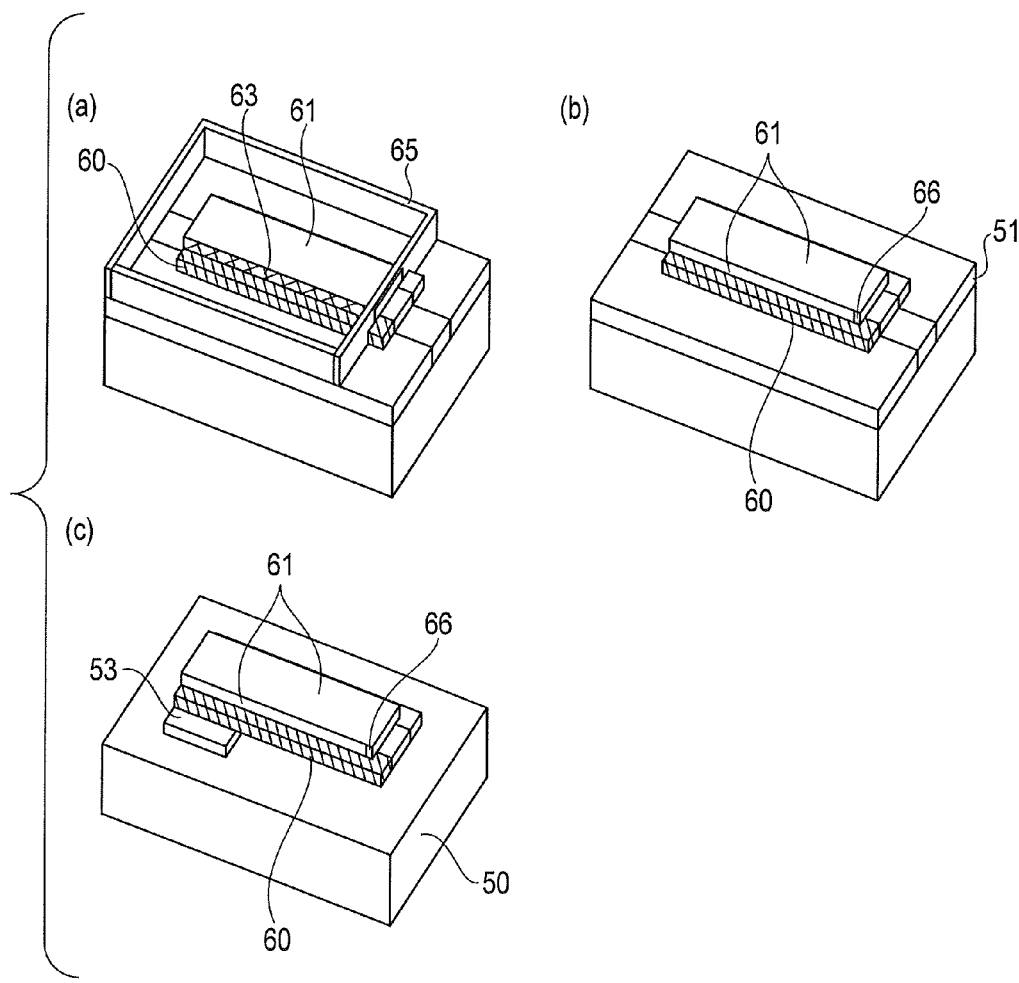
F I G. 8D

MICROPROBE AND MICROPROBE MANUFACTURING METHOD

CROSS-REFERENCE TO RELATED APPLICATIONS

This application is based upon and claims the benefit of priority from Japanese Patent Application No. 2013-054240, filed Mar. 15, 2013, the entire contents of which are incorporated herein by reference.

FIELD

Embodiments described herein relate generally to a microprobe and a method of manufacturing the microprobe.

BACKGROUND

In a probe device used in probe type storage, probe lithography or the like, it is necessary to stabilize an electrical characteristic thereof for a long period. If a probe is repeatedly used in direct contact with an object such as a recording medium, the tip of the probe is worn away. Therefore, the electrical contact of the probe device becomes unstable and the electrical characteristic may be degraded.

BRIEF DESCRIPTION OF THE DRAWINGS

FIGS. 5A and 5B are side views for illustrating the suppression of spreading of an electrical contact spot.

FIGS. 6A, 6B and 6C are a series of views showing an example of a process for manufacturing a microprobe according to the first embodiment.

FIG. 7 is a perspective view showing a probe type MEMS memory according to a second embodiment.

FIGS. 8A, 8B, 8C and 8D are a series of views showing an example of a process for manufacturing a microprobe according to the second embodiment.

DETAILED DESCRIPTION

In general, according to an embodiment, a microprobe includes a base and a lever. The base includes a first electrode provided on a surface thereof. The lever is supported by the base and includes a second electrode and a third electrode. The second electrode is connected between the first electrode and the third electrode. The third electrode is formed to project from the second electrode in a first direction in a main surface of the lever. A width of the third electrode in a second direction perpendicular to the first direction in the main surface defines a width of an electrical contact area when a scanning operation is performed by use of the third electrode in a third direction perpendicular to the main surface.

Various embodiments will be described hereinafter with reference to the accompanying drawings.

[First Embodiment]

A first embodiment relates to a probe type MEMS (Micro-Electro-Mechanical Systems) memory. The probe type MEMS memory utilizes the principle of a scanning probe microscope (SPM) and is a storage device that writes, reads and erases information by use of various interactions between the recording/reproducing electrode of the microprobe tip and a recording medium.

Figure 1:
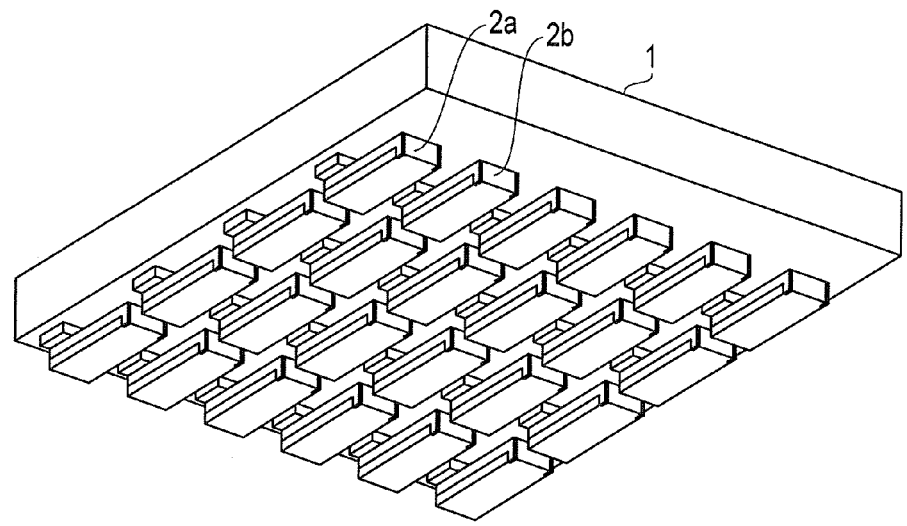
FIG. 1 is a perspective view showing a probe type MEMS memory according to a first embodiment.
Figure 2:
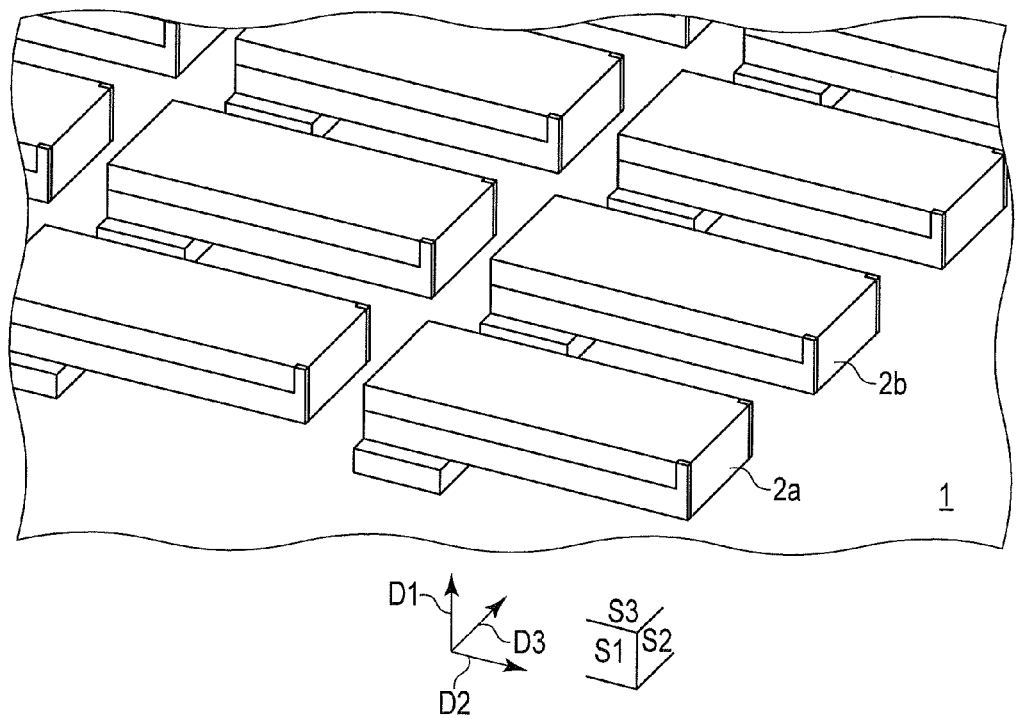
FIG. 2 is an enlarged view of a microprobe provided in the probe type MEMS memory of FIG. 1.

As shown in FIG. 1, the probe type MEMS memory of the first embodiment includes a multi-probe with a plurality of microprobes 2a, 2b, . . . arranged in an array form on a substrate 1. A portion near the microprobes 2a and 2b is enlarged and shown in FIG. 2. The plurality of microprobes including these microprobes 2a and 2b are arranged in two directions D2 and D3 with a predefined point on the surface of the substrate 1 used as an origin. When main surface S1, main surface S2 and main surface S3 of each microprobe are defined as shown in FIG. 2, an electrode of the probe tip is formed to project in direction D1 on main surface S1. At the time of writing, reading and erasing information, the substrate 1 is driven in direction D1 to bring the electrode of the probe tip into contact with a recording medium (not shown).

Figure 3:
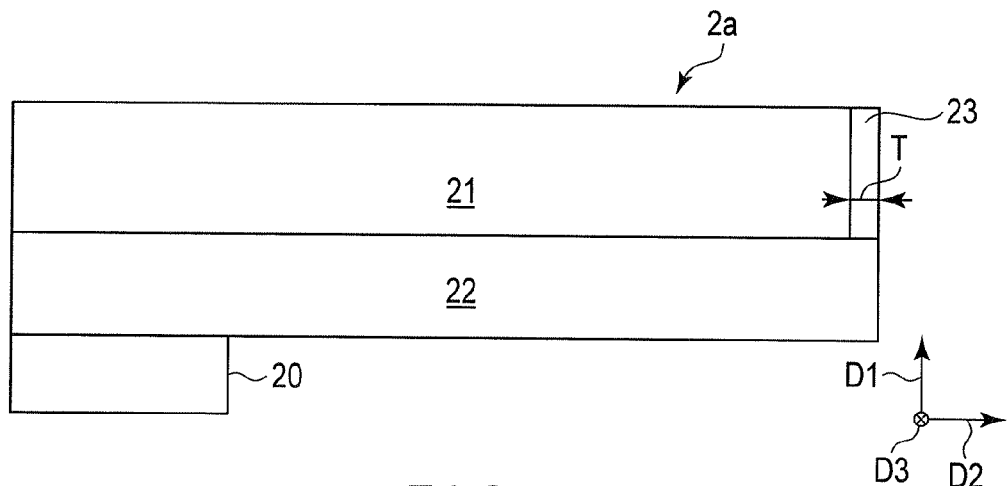
FIG. 3 is a side view of the microprobe.
Figure 4:
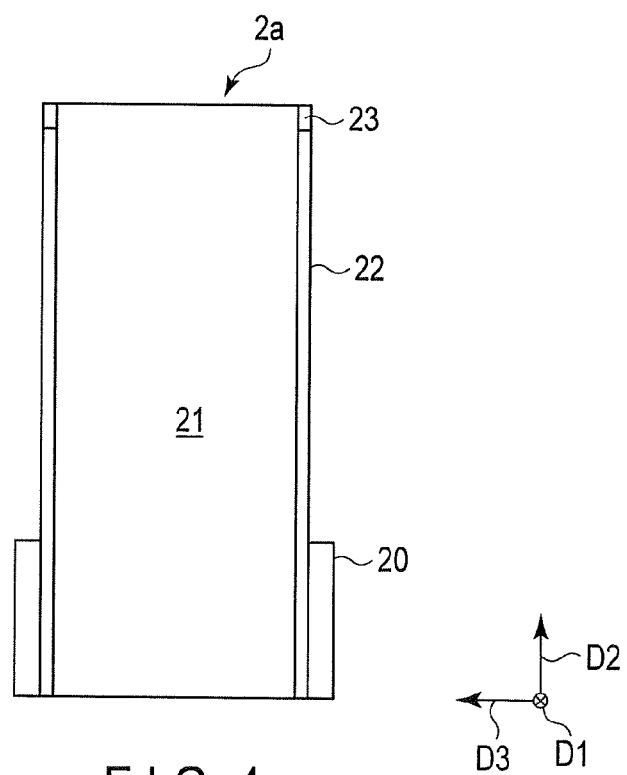
FIG. 4 is a top view of the microprobe.

FIG. 3 and FIG. 4 are a side view and top view of the microprobe 2a. The microprobe 2a includes a base 20 and a lever 21 formed to extend in direction D2 and having a basal portion coupled with the base 20. The base 20 (or at least the surface of the base 20) is a first electrode used for making an electrical connection with the exterior of the substrate 1. A second electrode 22 extending in direction D2 and a third electrode 23 extending in direction D1 are formed on main surface S1 of the lever 21. The second electrode 22 electrically connects the first electrode 20 with the third electrode 23. The second electrode 22 can be used instead of the structure having a through wire provided in the lever 21 to electrically connect the first electrode 20 with the third electrode 23 and contributes to a reduction in the manufacturing cost and a reduction in the manufacturing period.

In this case, the microprobe 2a is explained as an example, but another microprobe can be formed with the same structure.

The third electrode 23 is a narrow electrode having width T in direction D2 and a uniform cross section in direction D1 and this portion is used as an electrode of the probe tip to make contact with a recording medium (not shown). Since the third electrode 23 is formed of a narrow electrode, spreading of an electrical contact spot of the probe tip can be suppressed. This is explained with reference to FIGS. 5A and 5B.

FIG. 5A shows a microprobe 2a' having an electrode 23' formed on the entire portion of main surface S1, for example, and FIG. 5B shows the microprobe 2a of the present embodiment including the third electrode 23 formed as described above.

In the microprobe 2a' of FIG. 5A, the electrical contact area is area P1 when a scanning operation in which the microprobe is slid in scanning direction SD1 with respect to recording medium M is performed. However, if wear proceeds, the electrical contact area is area P2 when a scanning operation in which the microprobe is slid in scanning direction SD2 is performed, and the electrical contact spot is spread.

On the other hand, in the microprobe 2a of the present embodiment of FIG. 5B, since the third electrode 23 is formed narrow on main surface S1, a width of electrical contact area P3 when a scanning operation in which the microprobe is slid in scanning direction SD1 with respect to recording medium M is performed and a width of electrical contact area P4 set when a scanning operation in which the microprobe is slid in scanning direction SD2 is performed can be kept in substantially the same narrow range as is clearly seen from the FIG. 5B even if wear proceeds and spreading of the electrical contact spot caused by wear is suppressed. Therefore, the electrical characteristic of the microprobe can be stably maintained for a long period.

If a material of the third electrode 23 that is harder than the material of the lever 21 is used, the lever 21 is worn away earlier than the third electrode 23. That is, there is a difference between the wear amount of the third electrode 23 and the wear amount of the lever 21, and wear of the latter is greater, thus the third electrode 23 projects with respect to the lever 21. Therefore, breakage of the electrical connection of the probe tip due to wear can be prevented.

Figure 6C:
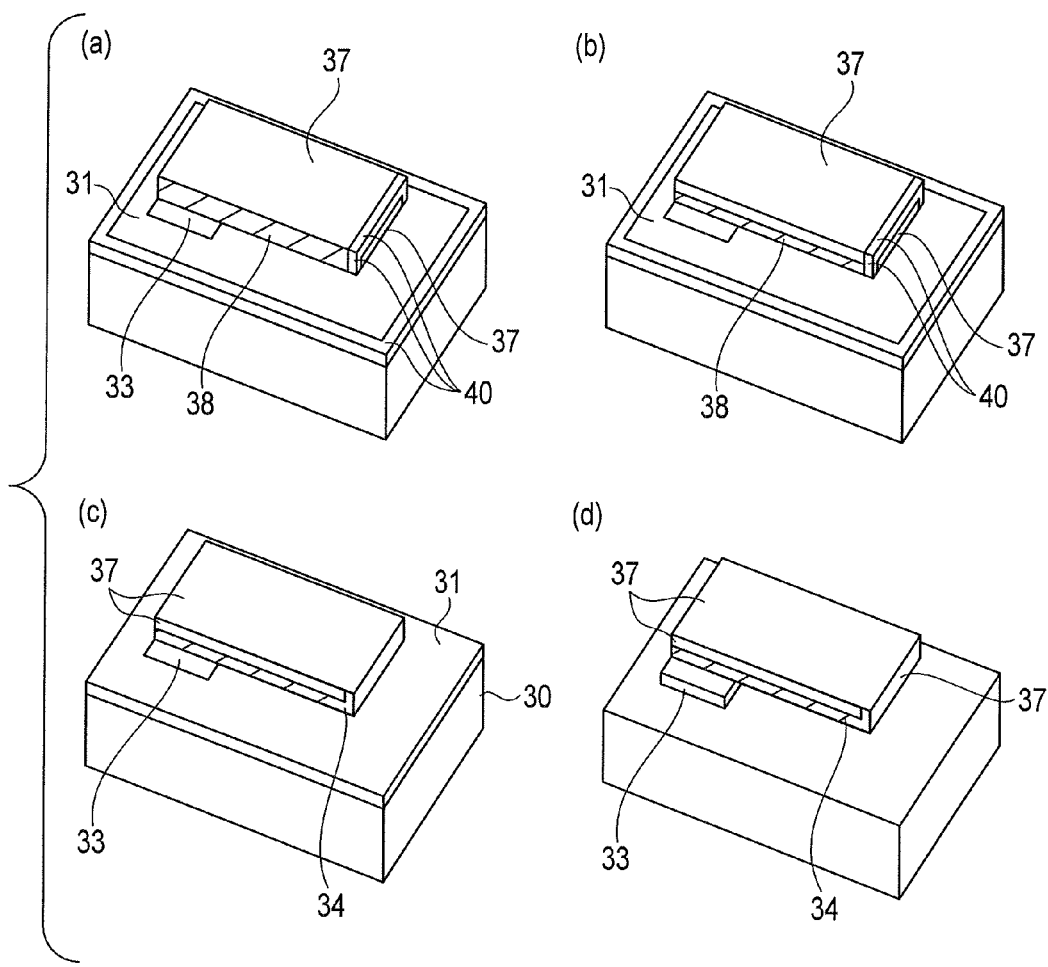

FIG. 6A to FIG. 6C show an example of a process for manufacturing the microprobe according to the first embodiment.

(Process 1)
First, a sacrifice layer 31 is formed on a silicon substrate 30 and concave portions used for formation of bases of a probe are formed by use of the lithography and reactive ion-etching (RIE) process ((a) of FIG. 6A). As a material of the sacrifice layer 31, for example, silicon oxide ($SiO_2$ or the like), silicon, a polymer or the like can be used.

(Process 2)
A parent body 32 of the bases of the probe is formed on the sacrifice layer 31 ((b) of FIG. 6A). As a material of the parent body 32, for example, tungsten, aluminum or the like can be used.

(Process 3)
The parent body 32 is polished by use of the chemical mechanical polishing (CMP) or the like until the sacrifice layer 31 is exposed. Thus, bases 33 of the probe are formed ((c) of FIG. 6A). The base 33 of the probe corresponds to the first electrode 20 described above.

(Process 4)
A parent body 35 of a lever of the probe is formed and a resist 36 used for formation of the lever is formed by use of the lithography process ((d) of FIG. 6A). As a material of the parent body 35 of the lever, for example, silicon, silicon nitride, silicon oxide ($SiO_2$) or the like can be used.

(Process 5)
A lever 37 of the probe is formed by removing a portion of the parent body 35 that is not protected by the resist 36 by use of the RIE process ((e) of FIG. 6A).

(Process 6)
The resist 36 used for formation of the lever is removed ((f) of FIG. 6A).

(Process 7)
Then, a metal thin film 38 is formed. The metal thin film 38 is used to form a sidewall electrode of the probe and corresponds to the second and third electrodes described above. As a material of the metal thin film 38, tungsten, ruthenium, platinum, molybdenum, titanium, gold, rhodium or the like can be used ((a) of FIG. 6B).

(Process 8)
The upper surface (main surface S3) is subjected to the RIE process to remove a portion of the metal thin film 38. As a result, the upper surfaces of the lever 37 and base 33 are exposed ((b) of FIG. 6B).

(Process 9)
The lithography process is performed to protect the entire portion of the upper surface except a distal end portion (37, 38) of the probe with a resist 39 ((c) of FIG. 6B).

(Process 10)
In this state, a mask 40 is formed to cover the entire surface of the upper portion. As a material of the mask 40, $SiO_2$, aluminum or the like can be used ((d) of FIG. 6B).

(Process 11)
A portion of the mask 40 is removed by use of the RIE process. As a result, the upper surfaces of the resist 39 and lever 37 are exposed ((e) of FIG. 6B).

(Process 12)
The distal end portion of the probe that is not covered with the resist 39 and is exposed to protrude, that is, a portion of the lever 37 (the mask 40 is formed on the sidewall thereof) is removed by use of the RIE process ((f) of FIG. 6B).

(Process 13)
After the resist 39 is removed, a mask 40 is formed in a narrow strip form to cover a distal end portion of the probe by use of the RIE process. The metal thin film 38 on the side surface is exposed ((a) of FIG. 6C).

(Process 14)
A portion of the metal thin film 38 that extends to an approximate mid-portion of the side surface (main surface S1) of the lever 37 is removed by use of the RIE process. At this time, since the mask 40 is not influenced by the action of the RIE process because of a difference in the material property, a portion of the metal thin film 38 that is protected by the mask 40 is left behind as it is ((b) of FIG. 6C).

(Process 15)
When the mask 40 is entirely removed, the electrode 34 of the lever 37 based on the etched metal thin film 38 is exposed to the exterior ((c) of FIG. 6C).

(Process 16)
Finally, the sacrifice layer 31 is removed to complete the probe ((d) of FIG. 6C). The base (first electrode) 33 of the probe and the electrode 34 (second electrode 22 and third electrode 23) of the lever 37 are electrically connected.

[Second Embodiment]

Like the first embodiment, a second embodiment relates to a probe type MEMS memory. In the second embodiment, a lever for supporting an electrode of the probe is formed with a multilayer structure. One of the objects of using the multilayer structure is to enhance the working accuracy in forming electrodes of the probe and simplifying the manufacturing process.

As shown in FIG. 7, the probe type MEMS memory according to the second embodiment includes a multi-probe having a plurality of microprobes 3 arranged in an array form on a substrate 1.

Each microprobe 3 includes a base 41, a lever lower layer 42 formed to extend in direction D2 and having a basal portion connected to the base 41, and a lever upper layer 43 formed on the lever lower layer 42.

The base 41 (or at least the surface of the base 41) is a first electrode used for making an electrical connection with the exterior of the substrate 1. A portion of the lever lower layer 42 (or at least the surface of lever lower layer 42) is a second electrode. A third electrode 44 is formed on the distal end portion of main surface S1 of the lever upper layer 43. The third electrode 44 is electrically connected to the first electrode 41 via the second electrode 42.

Like the first embodiment, the third electrode 44 is a narrow electrode having the narrow width in direction D2 and a cross section uniform in direction D1. This portion is used as an electrode of the probe tip to make contact with a recording medium (not shown). Since the third electrode 44 is formed of a narrow electrode, spreading of an electrical contact spot of the probe tip can be suppressed like the first embodiment. Therefore, the electrical characteristic of the microprobe can be stably maintained for a long period.

If a material of the third electrode 44 that is harder than the material of the lever upper layer 43 is used, the lever upper layer 43 is worn away earlier than the third electrode 44. That is, there is a difference between the wear amount of the third electrode 44 and the wear amount of the lever upper layer 43, and wear of the latter is greater, thus the third electrode 44 projects with respect to the lever upper layer 43. Therefore, breakage of the electrical connection of the probe tip due to wear can be prevented.

In this case, the microprobe 3 is explained as an example, but another microprobe may be formed with the same structure.

FIG. 8A to FIG. 8D show one example of a process for manufacturing the microprobe according to the second embodiment.

(Process 1)

Figure 8A:
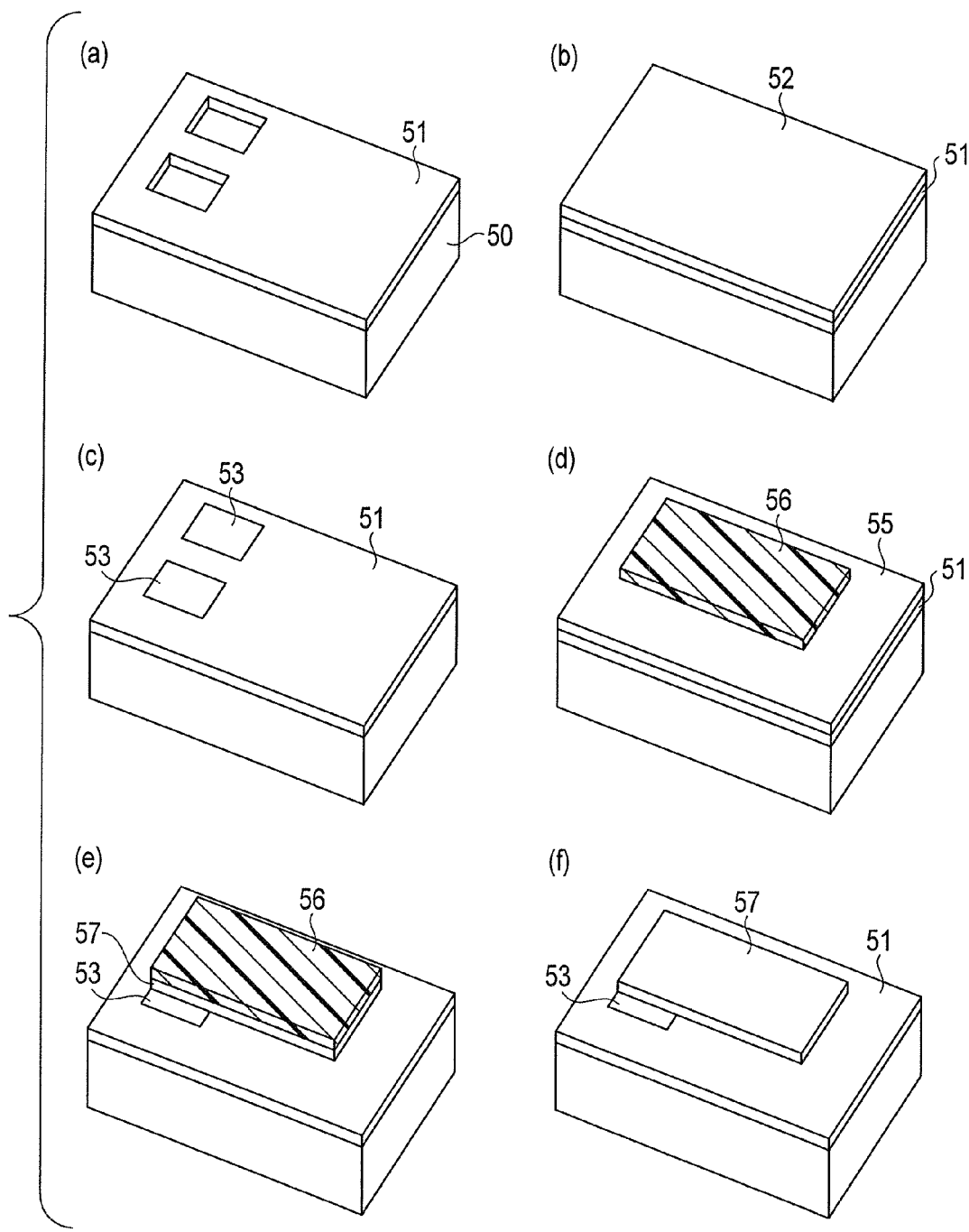

First, a sacrifice layer 51 is formed on a silicon substrate 50 and concave portions used for formation of bases of a probe are formed by use of the lithography and RIE process ((a) of FIG. 8A). As a material of the sacrifice layer 51, for example, silicon oxide ($SiO_2$ or the like), silicon, a polymer or the like can be used.

(Process 2)

A parent body 52 of the bases of the probe is formed on the sacrifice layer 51 ((b) of FIG. 8A). As a material of the parent body 52, for example, tungsten, aluminum or the like can be used.

(Process 3)

The parent body 52 is polished by use of the CMP or the like until the sacrifice layer 51 is exposed. Thus, bases 53 of the probe are formed ((c) of FIG. 8A). The base 53 of the probe corresponds to the first electrode described above.

(Process 4)

A parent body 55 of a lever lower layer of the probe is formed. A resist 56 used for formation of the lever lower layer is formed by use of the lithography process ((d) of FIG. 8A). As a material of the parent body 55 of the lever lower layer, for example, silicon oxide ($SiO_2$ or the like), silicon, polymer or the like can be used.

(Process 5)

A lever lower layer 57 of the probe is formed by removing a portion of the parent body 55 that is not protected by the resist 56 by use of the RIE process ((e) of FIG. 8A).

(Process 6)

The resist 56 used for formation of the lever lower layer of the probe is removed ((f) of FIG. 8A).

(Process 7)

Then, a metal thin film 58 is formed. The metal thin film 58 is used as an electrode on the surfaces of the lever lower layer 57 of the probe and corresponds to the second electrode described above. As a material of the metal thin film 58, tungsten, ruthenium, platinum, molybdenum, titanium, gold, rhodium or the like can be used ((a) of FIG. 8B).

(Process 8)

Resists 59 used for dividing the metal thin film 58 on the surface of the lever lower layer 57 of the probe into two portions are formed by use of the lithography process ((b) of FIG. 8B).

(Process 9)

A portion of the metal thin film 58 that is not protected by the resists 59 is removed by use of the RIE process. As a result, the lever lower layer 57 is exposed ((c) of FIG. 8B).

(Process 10)

Then, the resists 59 are removed. Thus, two second electrodes 60 formed of the metal thin films 58 are patterned on the surface of the lever lower layer 57 of the probe ((d) of FIG. 8B).

(Process 11)

A parent body 67 of a lever upper layer of the probe is formed ((e) of FIG. 8B). As a material of the parent body 67 of the lever upper layer of the probe, for example, silicon oxide ($SiO_2$ or the like), silicon, polymer or the like can be used. The material of the lever upper layer of the probe may be different from the material of the lever lower layer.

(Process 12)

A lever upper layer 61 of the probe is patterned on the parent body 67 by use of the lithography and RIE process ((f) of FIG. 8B).

(Process 13)

Then, a metal thin film 62 is formed. The metal thin film 62 is used as an electrode on the surface of the lever upper layer 61 of the probe and corresponds to the third electrode described above. As a material of the metal thin film 62, tungsten, ruthenium, platinum, molybdenum, titanium, gold, rhodium or the like can be used ((a) of FIG. 8C).

(Process 14)

The portion of the metal thin film 62 that is not formed on the side surfaces of the lever upper layer 61 of the probe is removed by use of the RIE process. As a result, a parent body 63 of the third electrode is formed on the lever upper layer 61 ((b) of FIG. 8C).

(Process 15)

Figure 8C:
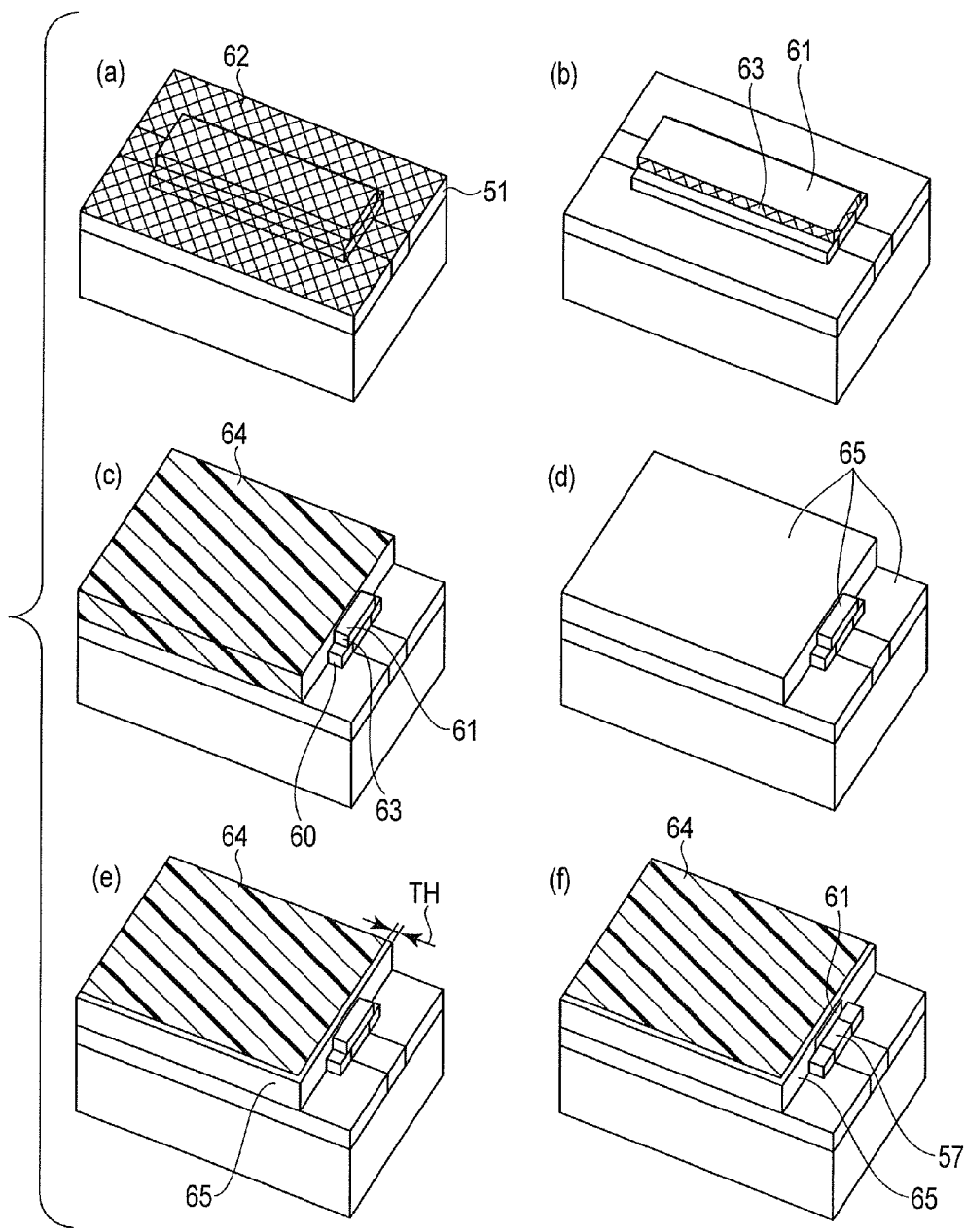

The entire portion of the upper surface except the eip portion (60, 61, 63) of the probe is protected with a resist 64 by use of the lithography process ((c) of FIG. 8C).

(Process 16)

In this state, a mask 65 is formed to cover the entire surface of the upper portion. As a material of the mask 65, $SiO_2$, aluminum or the like can be used ((d) of FIG. 8C).

(Process 17)

A portion of the mask 65 on the surface of the probe is removed by use of the RIE process. As a result, the upper surface of the resist 64 is exposed. Width TH of the mask 65 defines the width of the third electrode ((e) of FIG. 8C).

(Process 18)

A portion (a portion that projects in (e) of FIG. 8C) of the lever upper layer 61 of the probe is removed by use of the RIE process ((f) of FIG. 8C).

(Process 19)

The resist 64 is removed with the mask 65 left behind. The mask 65 is formed in a narrow strip form to cover the distal end portion of the lever upper layer 61. Then, the parent body 63 of the third electrode is exposed on the side surface of the lever upper layer 61 of the probe ((a) of FIG. 8D).

(Process 20)

The parent body 63 of the third electrode is removed on the side surface (main surface S1) of the lever upper layer 61 by use of the RIE process. At this time, since the mask 65 is not influenced by the action of the RIE process due to a difference in the material property, a portion of the parent body 63 of the third electrode that is protected by the mask 65 is left behind as it is. The portion is a third electrode 66. In the above RIE process, it is advantageous to easily perform a working control process in the depth direction from the lever upper layer 61 to the lever lower layer 57. When the mask 65 is removed, the third electrode 66 is exposed to the exterior ((b) of FIG. 8D).

(Process 21)

Finally, the sacrifice layer 51 is removed to complete the probe ((c) of FIG. 8D). The base 53 (first electrode) of the probe, the second electrode 60 of the lever lower layer 57 and the third electrode 66 of the lever upper layer are electrically connected.

[Third Embodiment]

A third embodiment relates to a probe type MEMS memory according to a modification of the second embodiment and is configured to have a plurality of third electrodes provided on the tip of each microprobe.

Figure 9:
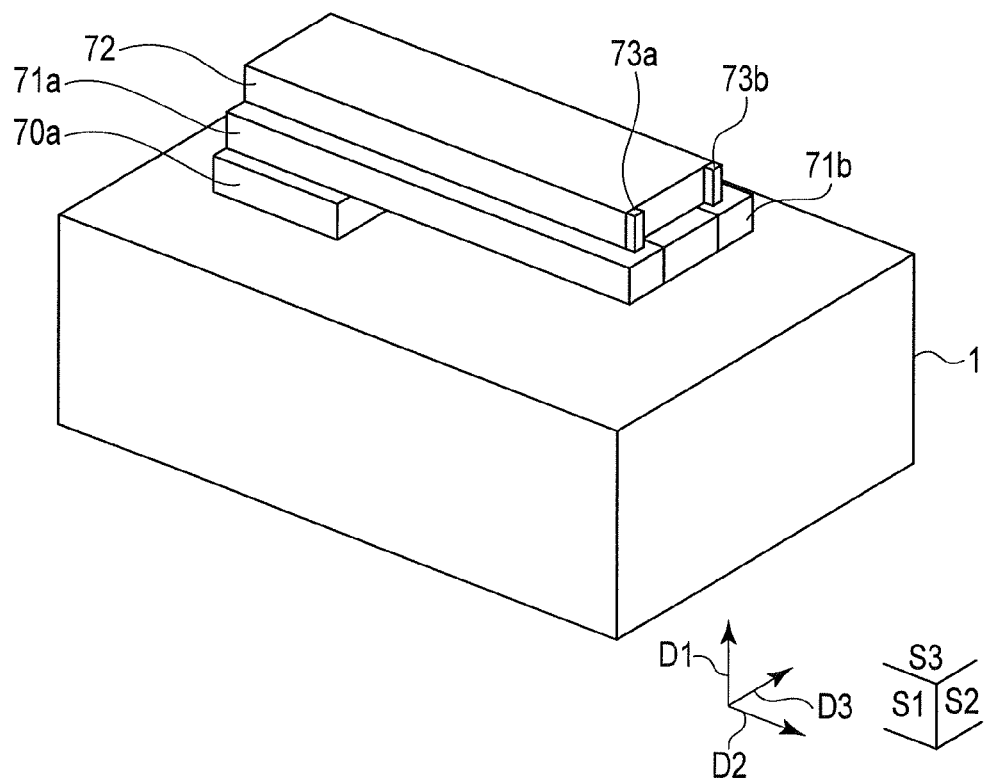
FIG. 9 is a perspective view showing a probe type MEMS memory according to an example of a third embodiment.

As shown in FIG. 9, a microprobe applied to a probe type MEMS memory according to an example of the present embodiment includes a base 70 configured to have two sub-bases 70a and 70b (shown in FIG. 10), a lever lower layer 71 formed to extend in direction D2 and having a basal portion coupled with the base 70 and a lever upper layer 72 formed on the lever lower layer 71.

The sub-base 70a is a sub first electrode used for making a first electrical connection with the exterior of a substrate 1 and the sub-base 70b is a sub first electrode used for making a second electrical connection with the exterior of the substrate 1.

The lever lower layer 71 includes a sub second electrode 71a electrically connected to the sub-base 70a, a sub second electrode 71b electrically connected to the sub-base 70b.

On main surface S2 of the lever upper layer 72, two sub third electrodes 73a and 73b are formed on the distal end portions thereof. The sub third electrode 73a is connected to the sub-base (sub first electrode) 70a via the sub second electrode 71a and the sub third electrode 73b is connected to the sub-base (sub first electrode) 70b via the sub second electrode 71b.

The sub second electrodes 71a and 71b can be used instead of the structure having through wires provided in the lever upper layer 72 and lever lower layer 71 to electrically connect the sub first electrodes 70a and 70b with the sub third electrodes 73a and 73b and contribute to a reduction in the manufacturing cost and a reduction in the manufacturing period.

Further, the sub first electrode 70a can control the sub third electrode 73a via the sub second electrode 71a and the sub first electrode 70b can control the sub third electrode 73b via the sub second electrode 71b. In this case, however, it is necessary to isolate the sub second electrodes 71a and 71b from each other at the lever lower layer 71 and lever upper layer 72. The reading or writing rate of the multi-probe can be controlled by individually controlling the sub third electrodes 73a and 73b.

Each of the sub third electrodes 73a and 73b is a narrow electrode that is formed narrow in direction D2 and has a uniform cross section in direction D1 like the second embodiment and is used as an electrode of the probe tip to make contact with a recording medium (not shown). Since the sub third electrodes 73a and 73b are formed of narrow electrodes, spreading of an electrical contact spot of the probe tip can be suppressed like the second embodiment. Therefore, the electrical characteristic of the microprobe can be stably maintained for a long period.

The manufacturing process of the microprobe according to the third embodiment is explained.

After two sub-bases 70a and 70b (sub first electrodes), lever lower layer 71 (two sub second electrodes 71a and 71b) and lever upper layer 72 are formed by the process shown in (a) of FIG. 8A to (f) of FIG. 8B of the second embodiment, a step is formed between main surface S2 of the lever lower layer 71 and main surface S2 of the lever upper layer 72 by use of the RIE process.

Figure 10:
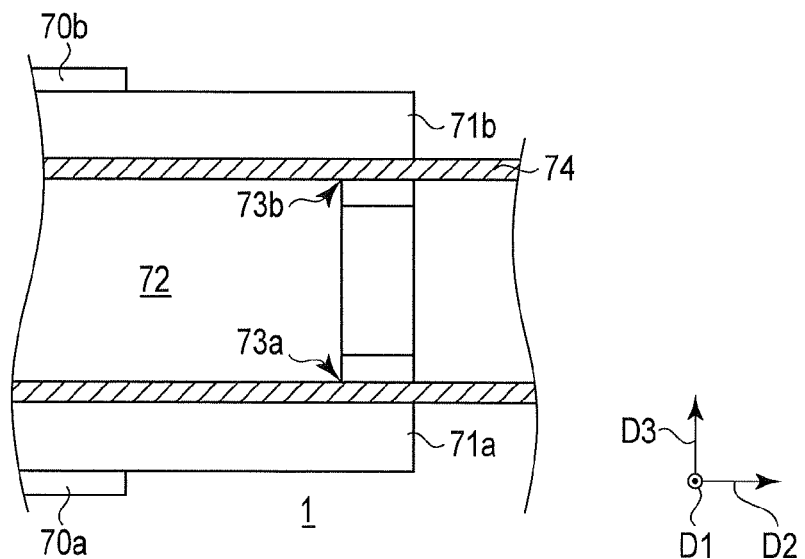
FIG. 10 is a view showing part of a process for manufacturing a microprobe according to the third embodiment.

Then, a metal thin film is formed on the upper surface including the lever lower layer 71. This is used as a parent body of the two sub third electrodes 73a and 73b. Next, as shown in FIG. 10, masks 74 used for protecting respective portions including the two sub third electrodes 73a and 73b on main surface S2 of the lever upper layer 72 are formed by use of the lithography and RIE process.

The parent body of the third electrodes is removed on the side surface (main surface S2) of the lever upper layer 72 by use of the RIE process. At this time, since the masks 74 are not influenced by the action of the RIE process due to a difference in the material property, portions of the parent body of the third electrodes that are protected by the masks 74 are left behind. The portions are used as the two third electrodes 73a and 73b. In the above RIE process, it is advantageous to easily perform a working control process in the depth direction from the lever upper layer 72 to the lever lower layer 71. When the masks 74 are removed, the two third electrodes 73a and 73b are exposed to the exterior.

Figure 11:
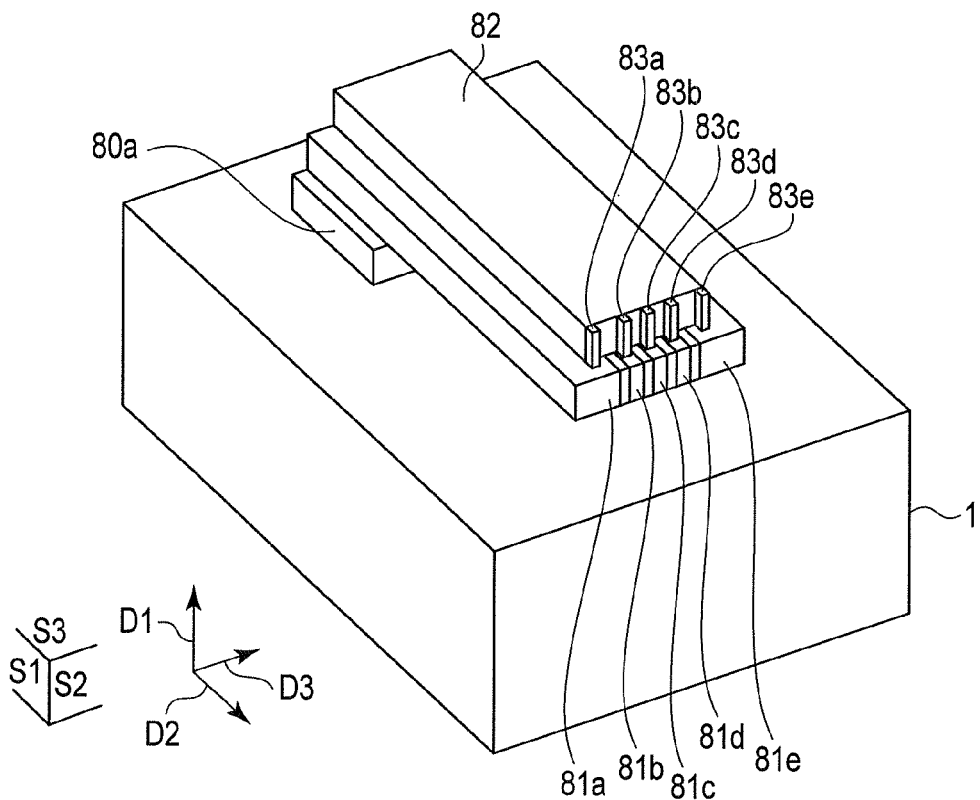
FIG. 11 is a perspective view showing a probe type MEMS memory according to another example of the third embodiment.
Figure 12:
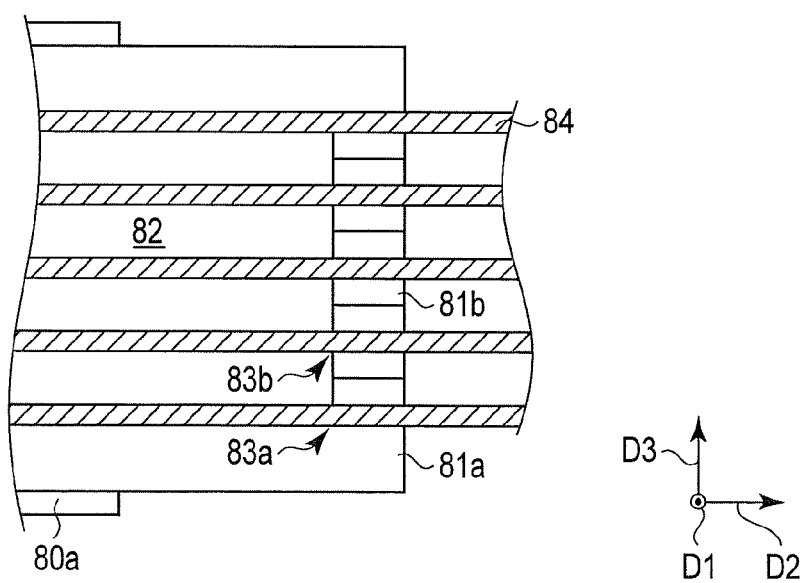
FIG. 12 is a view showing part of a process for manufacturing the microprobe according to the third embodiment.

Next, another example of the third embodiment is explained with reference to FIGS. 11 and 12. A microprobe of the third embodiment includes a base 80 including three or more sub-bases 80a, 80b (not shown), . . . , a lever lower layer 81 formed to extend in direction D2 and having a basal portion connected to the base 80, and a lever upper layer 82 formed on the lever lower layer 81.

The sub-base 80a is a sub first electrode used for making a first electrical connection with the exterior of a substrate 1, the sub-base 80b is a sub first electrode used for making a second electrical connection with the exterior of the substrate 1, and so on.

The lever lower layer 81 includes a sub second electrode 81a electrically connected to the sub-base 80a, a sub second electrode 81b electrically connected to the sub-base 80b (not shown), and so on.

Three or more sub third electrodes 83a, 83b, . . . are formed on the distal end portion of main surface S2 of the lever upper layer 82. The sub third electrode 83a is connected to the sub-base 80a (sub first electrode) via the sub second electrode 81a, the sub third electrode 83b is connected to the sub-base 80b (sub first electrode) via the sub second electrode 81b, and so on.

The sub second electrodes 81a, 81b, . . . can be used instead of the structure having through wires provided in the lever upper layer 82 and lever lower layer 81 to electrically connect the sub first electrodes 80a, 80b, . . . with the sub third electrodes 83a, 83b, . . . and contribute to a reduction in the manufacturing cost and a reduction in the manufacturing period.

Further, the sub first electrode 80a can control the sub third electrode 83a via the sub second electrode 81a and the sub first electrode 80b can control the sub third electrode 83b via the sub second electrode 81b. In this case, however, it is necessary to isolate the sub second electrodes 81a, 81b, . . . from each other at the lever lower layer 81 and lever upper layer 82. The reading or writing rate of the multi-probe can be controlled by individually controlling the sub third electrodes 83a, 83b, . . . .

Each of the sub third electrodes 83a, 83b, . . . is a narrow electrode that is formed narrow in direction D2 and has a uniform cross section in direction D1 like the second embodiment and this portion is used as an electrode of the probe tip to make contact with a recording medium (not shown). Since the sub third electrodes 83a, 83b, are formed of narrow electrodes, spreading of an electrical contact spot of the probe tip can be suppressed like the second embodiment. Therefore, the electrical characteristic of the microprobe can be stably maintained for a long period.

The manufacturing process of the above microprobe is explained.

After a plurality of sub-bases (sub first electrodes) 80a, 80b, . . . , lever lower layer 81 (a plurality of sub second electrodes 81a, 81b, . . . ) and lever upper layer 82 are formed by the process shown in (a) of FIG. 8A to (f) of FIG. 8B of the second embodiment, a step is formed between main surface S2 of the lever lower layer 81 and main surface S2 of the lever upper layer 82 by use of the RIE process.

Then, a metal thin film is formed on the upper surface including the lever lower layer 81. This is used as a parent body of the sub third electrodes 83a, 83b, . . . . Next, as shown in FIG. 12, masks 84 used for protecting respective portions including the sub third electrodes 83a, 83b, . . . on main surface S2 of the lever upper layer 82 is formed by use of the lithography and RIE process.

The parent body of the sub third electrodes is removed on the side surface (main surface S2) of the lever upper layer 82 by use of the RIE process. At this time, since the masks 84 are not influenced by the action of the RIE process due to a difference in the material property, portions of the parent body of the sub third electrodes that are protected by the masks 84 are left behind as they are. The portions are used as the sub third electrodes 83a, 83b, . . . . In the above RIE process, it is advantageous to easily perform a working control process in the depth direction from the lever upper layer 82 to the lever lower layer 81. When the masks 84 are removed, the sub third electrodes 83a, 83b, . . . are exposed to the exterior.

[Fourth Embodiment]

A fourth embodiment relates to probe lithography.

Figure 13:
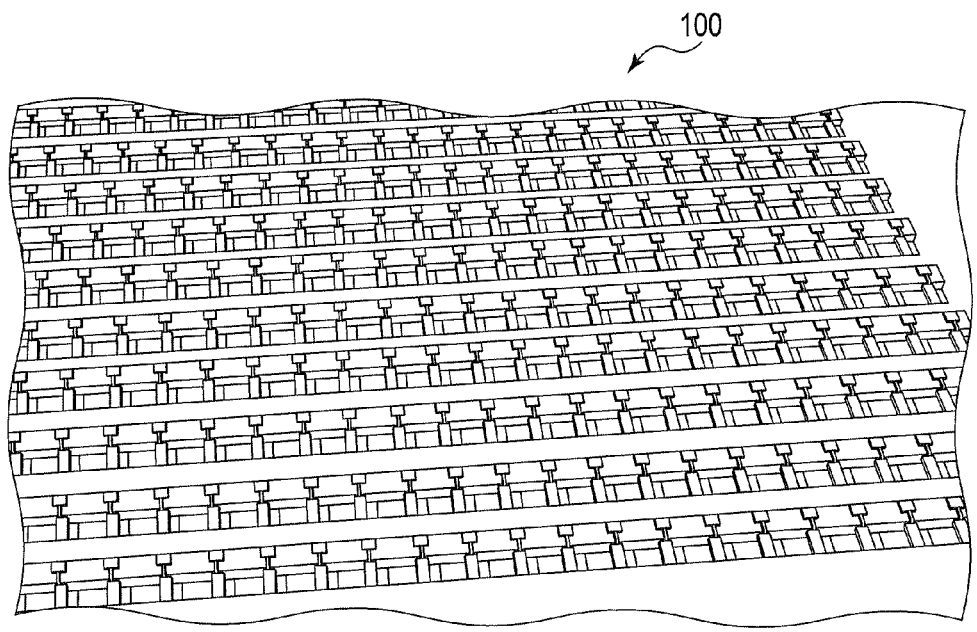
FIG. 13 is a perspective view showing a probe lithography device according to a fourth embodiment.
Figure 14:
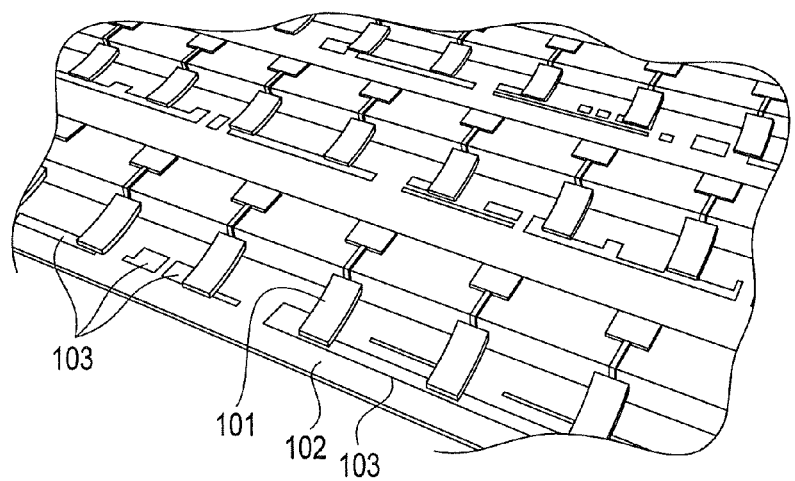
FIG. 14 is an enlarged view of the probe lithography device according to the fourth embodiment.

FIG. 13 shows a probe lithography device 100 according to the present embodiment. FIG. 14 is an enlarged view of the main portion of the probe lithography device 100. As shown in FIG. 14, a microprobe 101 is used to draw a pattern 103 on a drawing silicon substrate 102. Like the first to third embodiments described above, the microprobe 101 has at least one third electrode on the tip thereof. A bias applied to the third electrode is set on when the pattern 103 is drawn and a bias applied to the third electrode is set off at the non-drawing time.

Figure 15:
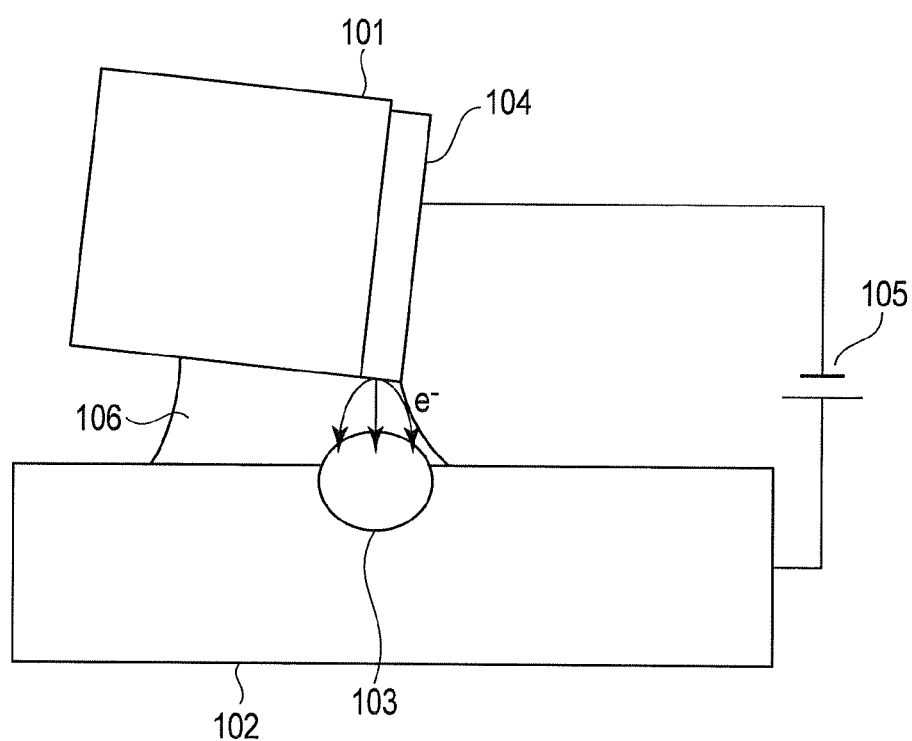
FIG. 15 is a view showing the drawing principle of the probe lithography according to the fourth embodiment.

The drawing principle of the probe lithography is explained with reference to FIG. 15. The microprobe 101 is brought into contact with the silicon substrate 102 in an atmosphere and the pattern 103 is scanned while a voltage is applied between a third electrode 104 and the silicon substrate 102 by means of a power source 105. At this time, adsorbed water ($H_2O$) present in a portion between the third electrode 104 and the silicon substrate 102 acts on an infinitesimal current ($e^-$) flowing between the third electrode 104 and the silicon substrate 102 and an anodic oxidation reaction occurs due to the electrolyzed water. As a result, a pattern 103 of the oxidative product is formed. The reaction formula is $Si + 4H^+ + 2OH^- \rightarrow SiO_2 + 2H^+$.

Like the first to third embodiments, in the probe lithography device according to the fourth embodiment, since the third electrode 104 is formed narrow, spreading of the electrical contact spot caused by wear can be suppressed and a lowering in the quality of the drawing pattern can be suppressed.

If a plurality of third electrodes are provided on the microprobe 101 as in the third embodiment and the third electrodes can be individually controlled, the drawing rate of the pattern 103 can be controlled.

According to at least one of the embodiments described above, there are provided a microprobe in which the electrical characteristic is stabilized for a long period by suppressing spreading of an electrical contact spot of the probe tip, and a method of manufacturing the microprobe.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A microprobe comprising:
   a base including a first electrode provided on a surface thereof; and
   a lever supported by the base and including a second electrode and a third electrode;
   wherein the second electrode is connected between the first electrode and the third electrode, the third electrode is formed at a tip portion of the lever to project from the second electrode in a first direction in a main surface of the lever, a width of the third electrode in a second direction perpendicular to the first direction in the main surface corresponds to a width of an electrical contact area when a scanning operation is performed by use of the third electrode in a third direction perpendicular to the main surface, and the width of the third electrode in the second direction is narrower than a width of the tip portion in the second direction.

2. The microprobe according to claim 1, wherein the lever comprises a lever lower layer and a lever upper layer, the second electrode being formed on a first main surface and a second main surface of the lever lower layer, the second main surface being perpendicular to the first main surface, the third electrode being formed on a first main surface of the lever upper layer, and
   wherein the second main surface of the lever lower layer is perpendicular to the first main surface of the lever upper layer.

3. The microprobe according to claim 2, wherein a material of the lever lower layer is different from a material of the lever upper layer.

4. The microprobe according to claim 2, wherein a shape of the lever lower layer is different from a shape of the lever upper layer.

5. The microprobe according to claim 1, wherein a hardness of a material of the third electrode is higher than a hardness of a material of the lever.

6. The microprobe according to claim 2, wherein a hardness of a material of the third electrode is higher than a hardness of a material of the lever upper layer.

7. The microprobe according to claim 1, wherein the third electrode has a cross section uniform in the first direction.

8. The microprobe according to claim, 1, wherein the lever comprises a lever lower layer and a lever upper layer, a plurality of second electrodes being formed on a surface of the lever lower layer, a plurality of third electrodes being formed on a surface of lever upper layer.

9. The microprobe according to claim 2, a plurality of second electrodes being formed on a surface of the lever lower layer, a plurality of third electrodes being formed on a surface of lever upper layer.

10. A microprobe manufacturing method comprising:
   forming a first electrode on a surface of a base;
   forming a lever supported by the base;
   forming a parent body of a second electrode and a third electrode on the lever;
   forming a mask on a portion of the parent body corresponding to the third electrode;
   forming the second electrode by etching based on a difference between a material of the second electrode and a material of the mask; and
   removing the mask to form the third electrode,
   wherein the third electrode is formed at a tip portion of the lever to project from the second electrode in a first direction in a main surface of the lever a width of the third electrode in a second direction perpendicular to the first direction in the main surface defines a width of an electrical contact area when a scanning operation is performed by use of the third electrode in a third direction perpendicular to the main surface, and the width of the third electrode in the second direction is narrower than a width of the tip portion in the second direction.

11. A microprobe comprising:
   a base including a first electrode provided on a surface thereof; and
   a lever supported by the base and including a second electrode and a third electrode;
   wherein the second electrode is connected between the first electrode and the third electrode, the third electrode is formed to project from the second electrode in a first direction in a main surface of the lever, and a width of the third electrode in a second direction perpendicular to the first direction in the main surface corresponds to a width of an electrical contact area when a scanning operation is performed by use of the third electrode in a third direction perpendicular to the main surface,
   wherein the lever comprises a lever lower layer and a lever upper layer, the second electrode being formed on a first main surface and a second main surface of the lever lower layer, the second main surface being perpendicular to the first main surface, the third electrode being formed on a first main surface of the lever upper layer, and
   wherein the second main surface of the lever lower layer is perpendicular to the first main surface of the lever upper layer.

12. The microprobe according to claim 11, wherein a material of the lever lower layer is different from a material of the lever upper layer.

13. The microprobe according to claim 11, wherein a shape of the lever lower layer is different from a shape of the lever upper layer.

14. The microprobe according to claim 11, wherein a hardness of a material of the third electrode is higher than a hardness of a material of the lever upper layer.

15. The microprobe according to claim 11, a plurality of second electrodes being formed on a surface of the lever lower layer, a plurality of third electrodes being formed on a surface of lever upper layer.

* * * * *